(12) United States Patent
Hironaka et al.

(10) Patent No.: US 11,320,461 B2
(45) Date of Patent: May 3, 2022

(54) PROBE UNIT

(71) Applicant: NHK Spring Co., Ltd., Yokohama (JP)

(72) Inventors: Kohei Hironaka, Kanagawa (JP);
Tsuyoshi Inuma, Kanagawa (JP); Shuji Takahashi, Kanagawa (JP)

(73) Assignee: NHK Spring Co., Ltd., Yokohama (JP)

( * ) Notice: Subject to any disclaimer, the term of this patent is extended or adjusted under 35 U.S.C. 154(b) by 0 days.

(21) Appl. No.: 16/629,147

(22) PCT Filed: Jul. 12, 2018

(86) PCT No.: PCT/JP2018/026351
§ 371 (c)(1),
(2) Date: Jan. 7, 2020

(87) PCT Pub. No.: WO2019/013289
PCT Pub. Date: Jan. 17, 2019

(65) Prior Publication Data
US 2020/0225265 A1 Jul. 16, 2020

(30) Foreign Application Priority Data
Jul. 13, 2017 (JP) .............................. JP2017-137391

(51) Int. Cl.
*G01R 1/073* (2006.01)
*G01R 1/067* (2006.01)
(Continued)

(52) U.S. Cl.
CPC ..... *G01R 1/07314* (2013.01); *G01R 1/06722* (2013.01); *G01R 31/2884* (2013.01);
(Continued)

(58) Field of Classification Search
CPC .................... G01R 1/07314; G01R 1/06722
See application file for complete search history.

(56) References Cited

U.S. PATENT DOCUMENTS 7,845,955 B2 12/2010 Nakayama et al.
7,950,927 B2 * 5/2011 Kazama .................. G01R 3/00
439/66

(Continued)

FOREIGN PATENT DOCUMENTS

JP S60-082271 U 6/1985
JP H05-126850 A 5/1993
(Continued)

OTHER PUBLICATIONS

Office Action dated May 7, 2019, issued for the TW Patent Application No. 107124290 and English translation thereof.
(Continued)

*Primary Examiner* — Paresh Patel
(74) *Attorney, Agent, or Firm* — Locke Lord LLP

(57) ABSTRACT

A probe unit includes: a plurality of contact probes each of which has one end that is brought into contact with a contacting electrode, the one end being an end in a longitudinal direction; a first ground member connected to an external ground; a second ground member provided around each of the contact probes; a connecting member electrically connected to the first ground member, and electrically connected to one end of the second ground member; and a probe holder configured to hold the contact probes, the first ground member, the second ground member and the connecting member.

10 Claims, 12 Drawing Sheets

(51) Int. Cl.
*G01R 31/28* (2006.01)
*H01R 13/24* (2006.01)
*H01R 13/6473* (2011.01)

(52) U.S. Cl.
CPC ..... *G01R 31/2886* (2013.01); *H01R 13/2407* (2013.01); *H01R 13/6473* (2013.01); *H01R 2201/20* (2013.01)

(56) References Cited

U.S. PATENT DOCUMENTS

| | | | |
|---|---|---|---|
| 8,911,266 B2 | 12/2014 | Kawate et al. | |
| 2005/0088189 A1* | 4/2005 | Yanagisawa | G01R 1/06772 324/755.02 |
| 2007/0111560 A1* | 5/2007 | Kazama | G01R 1/0483 439/71 |
| 2007/0145991 A1* | 6/2007 | Yoshida | G01R 1/045 324/755.01 |
| 2009/0311890 A1* | 12/2009 | Nakayama | G01R 1/07371 439/91 |
| 2013/0065455 A1* | 3/2013 | Kawata | H01L 23/32 439/700 |

FOREIGN PATENT DOCUMENTS

| | | |
|---|---|---|
| JP | 2005-172464 A | 6/2005 |
| JP | 2007-178163 A | 7/2007 |
| JP | 2011-252766 A | 12/2011 |
| JP | 2012-103028 A | 5/2012 |
| JP | 2017-096646 A | 6/2017 |
| TW | 200745559 A | 12/2007 |
| WO | 2007/125974 A1 | 11/2007 |

OTHER PUBLICATIONS

International Search Report dated Oct. 2, 2018, issued for PCT/JP2018/026351.

* cited by examiner

PROBE UNIT

FIELD

The present invention relates to a probe unit for housing a signal conductive contactor via which electric signals are input to and output from a predetermined circuit structure.

BACKGROUND

When conductions or operation characteristics of a device under test, such as a semiconductor integrated circuit or a liquid crystal panel, is to be tested, conventionally having been in use is a probe unit that includes contact probes for establishing electrical connections between the device under test and a signal processing device that outputs test signals, and a probe holder in which the contact probes are housed.

Generally, when input and output are high-frequency electric signals, the signals go through a signal loss referred to as an insertion loss. To allow a conductive contactor unit to operate highly accurately at a high speed, it is important to reduce the insertion loss in the frequency range to be used.

For example, Patent Literature 1 discloses a technology for ensuring the impedance of contact pins, by arranging signal contact probes and ground contact probes in a checkered pattern, considering each of the signal contact probes and the ground contact probes that are installed around the signal contact probes as a contact pin having a coaxial structure. According to Patent Literature 1, the insertion loss is reduced by ensuring the impedance of the contact pins.

CITATION LIST

Patent Literature

Patent Literature 1: Japanese Laid-open Patent Publication No. H5-126850

SUMMARY

Technical Problem

However, in the technology disclosed in Patent Literature 1, because the signal contact probes and the ground contact probes are arranged in a checkered pattern, there has not been much freedom in the impedance adjustment.

The present invention is made in consideration of the above, and an object of the present invention is to provide a probe unit capable of improving the freedom in the impedance adjustment.

Solution to Problem

To solve the above-described problem and achieve the object, a probe unit according to the present invention includes: a plurality of contact probes each of which has one end that is brought into contact with a contacting electrode, the one end being an end in a longitudinal direction; a first ground member connected to an external ground; a second ground member provided around each of the contact probes; a connecting member electrically connected to the first ground member, and electrically connected to one end of the second ground member; and a probe holder configured to hold the contact probes, the first ground member, the second ground member and the connecting member.

Moreover, in the above-described probe unit according to the present invention, the second ground member is a conductive member provided around the contact probe, electrically connected to the connecting member, and configured to extend and contract in a long-axial direction.

Moreover, in the above-described probe unit according to the present invention, the connecting member is a plate-like conductive member.

Moreover, in the above-described probe unit according to the present invention, the connecting member has an insertion hole through which the first ground member is passed, and a part of which is brought into contact with the first ground member.

Moreover, in the above-described probe unit according to the present invention, the connecting member includes: a base portion made of an insulating material; and a conductive member provided on an outer surface of the base portion, the outer surface being a surface on a side where the connecting member is connected to the second ground member, the conductive member being electrically connected to the first ground member.

Moreover, in the above-described probe unit according to the present invention, the base portion has an insertion hole allowing the first ground member to be passed therethrough, and the conductive member is configured to extend across the surface on the side where the connecting member is connected to the second ground member, to an inner wall of the insertion hole.

Moreover, in the above-described probe unit according to the present invention, the conductive member is a film made of a conductive material film.

Moreover, in the above-described probe unit according to the present invention, the conductive member is a plate-like member made of a conductive material.

Moreover, in the above-described probe unit according to the present invention, the second ground member includes: an insulating pipe member provided around the contact probe; and a conductive member provided to an outer circumference of the pipe member, and electrically connected to the connecting member.

Moreover, in the above-described probe unit according to the present invention, the conductive member has a plurality of through holes passing through in radial directions that perpendicularly intersect with a longitudinal axis of the conductive member.

Advantageous Effects of Invention

According to the present invention, freedom in the impedance adjustment can be improved, advantageously.

DESCRIPTION OF EMBODIMENTS

Figure 1:
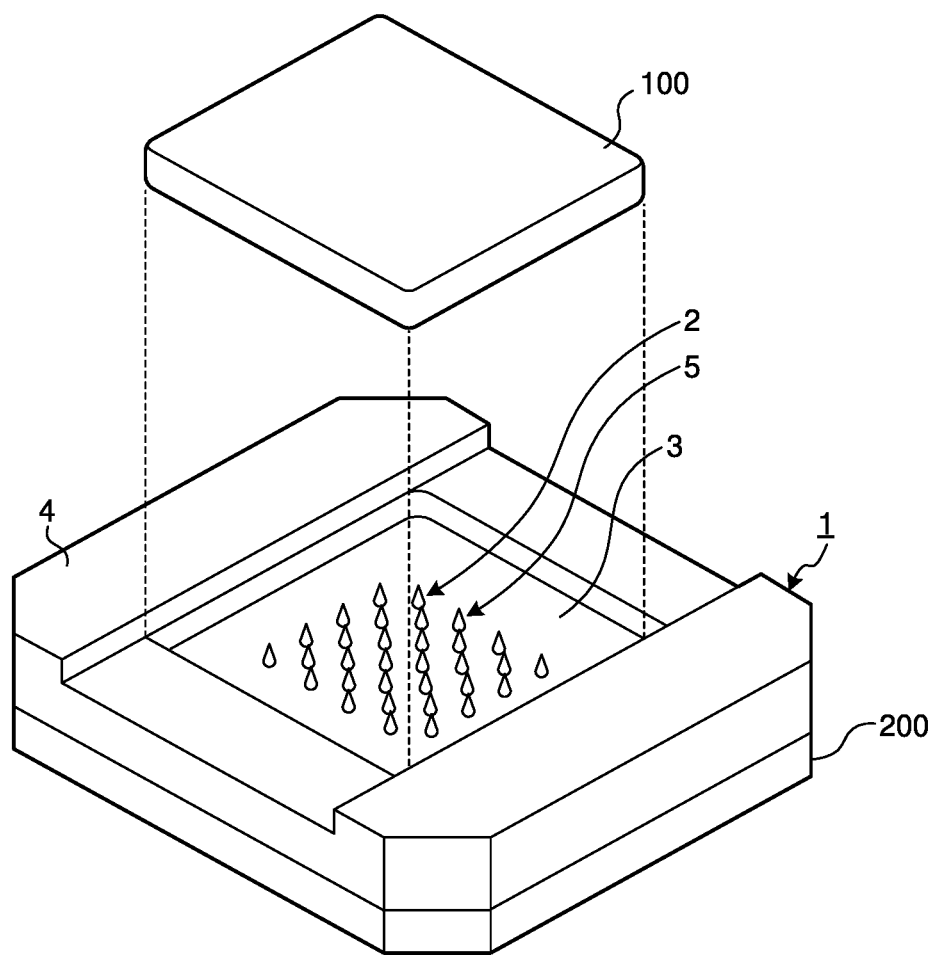
FIG. 1 is a perspective view illustrating a structure of a probe unit according to a first embodiment of the present invention.

Some embodiments for implementing the present invention will now be explained in detail with reference to some drawings. The embodiments described below are, however, not intended to limit the scope of the present invention in any way. The drawings to which references are made in the following explanation illustrate shapes, sizes, and positional relations only schematically, to a degree enough to enable understanding of the descriptions of the present invention, and therefore, the present invention is not limited to the shapes, the sizes, and the positional relations illustrated in the drawings.

First Embodiment

FIG. 1 is a perspective view illustrating a structure of a probe unit according to a first embodiment of the present invention. This probe unit 1 illustrated in FIG. 1 is a device used in testing the electric characteristics of a semiconductor integrated circuit 100 that is a device under test, and is a device that electrically connects the semiconductor integrated circuit 100 and a circuit board 200 that outputs test signals to the semiconductor integrated circuit 100.

The probe unit 1 includes a signal contact probe 2 (hereinafter simply referred to as a "signal probe 2") that has both ends thereof, in the longitudinal direction, brought into contact with the semiconductor integrated circuit 100 and the circuit board 200, respectively, which are two different objects to be brought into contact with, and via which the test signals are conducted; a probe holder 3 that houses and holds a plurality of the signal probes 2 and a first contact probe 5, which is described later, in a predetermined pattern; a holder member 4 that is provided around the probe holder 3, and that suppresses a displacement of the semiconductor integrated circuit 100 being brought into contact with the signal probes 2 and the first contact probe 5 during a test; the first contact probe 5 for grounding (hereinafter referred to as a first grounding probe 5) that is connected to an external ground electrode; a second contact probe 6 (hereinafter referred to as a second grounding probe 6) that is electrically connected to the first grounding probe 5, and that is enabled to extend and to contract in the long-axial direction; and a connecting member 7 that is brought into contact with the first grounding probe 5 and the second grounding probe 6, and that electrically connects the first grounding probe 5 and the second grounding probe 6 (see FIG. 2 for the second grounding probe 6 and the connecting member 7).

Figure 2:
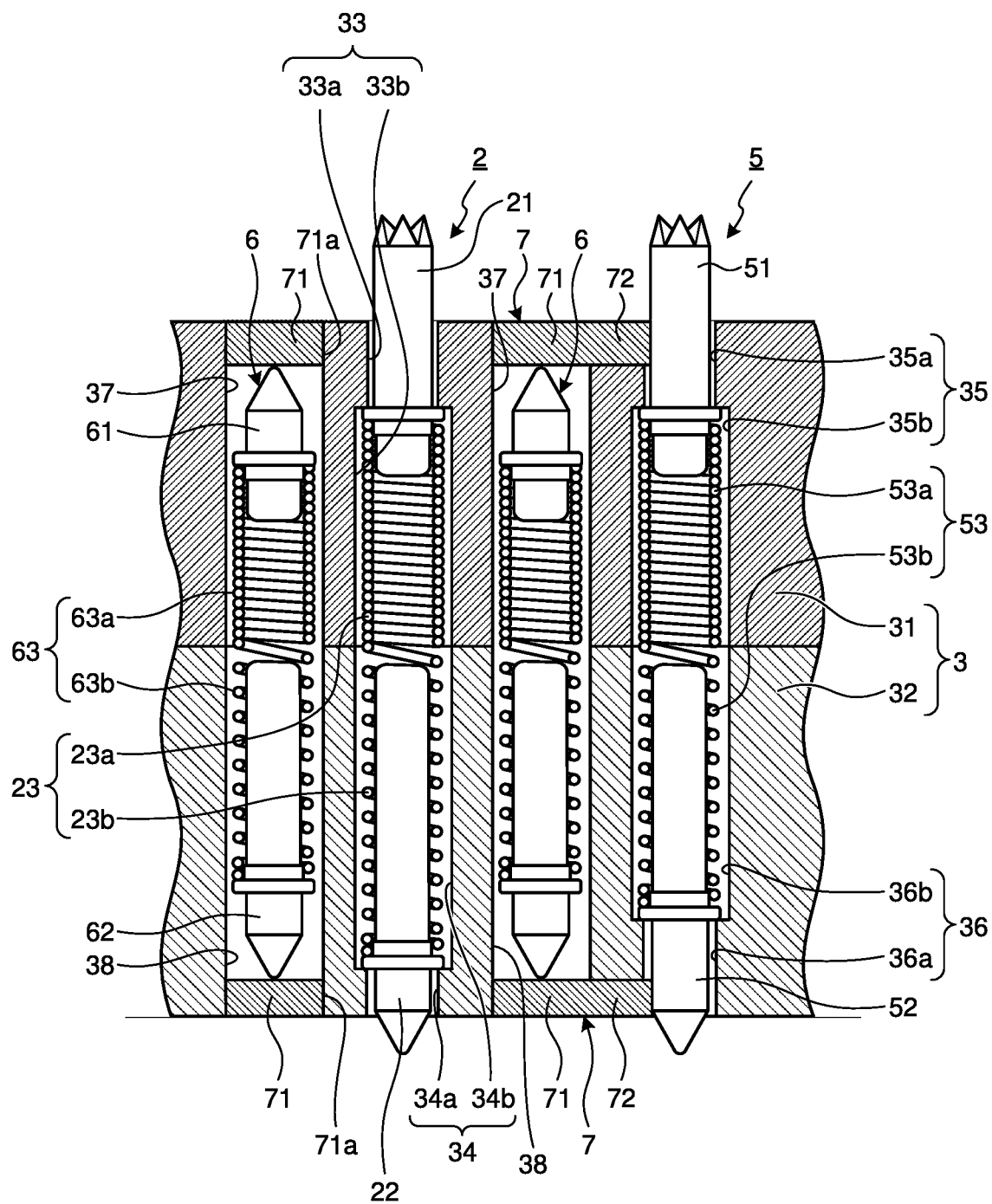
FIG. 2 is a partial sectional view illustrating a structure of a relevant portion of the probe unit according to the first embodiment of the present invention.

FIG. 2 is a schematic illustrating a detailed structure of the probes (the signal probe 2, the first grounding probe 5, and the second grounding probe 6) housed in the probe holder 3. The signal probe 2 is made of a conductive material, and includes a first plunger 21 that is brought into contact with an electrode of the semiconductor integrated circuit 100, the electrode being an electrode to which a test signal is input during a test of the semiconductor integrated circuit 100; a second plunger 22 that is brought into contact with an electrode of the circuit board 200 having a testing circuit, the electrode being an electrode via which the test signal from the circuit board 200 is output; and a spring member 23 that is provided between the first plunger 21 and the second plunger 22, and that couples the first plunger 21 and the second plunger 22 in an extendable and contractible manner. The first plunger 21, the second plunger 22, and the spring member 23 making up the signal probe 2 share the same axial line. By causing the spring member 23 to extend and to contract in the axial line direction as the semiconductor integrated circuit 100 is brought into contact, the signal probe 2 alleviates the impact applied to connected electrodes of the semiconductor integrated circuit 100, and also applies a load to the semiconductor integrated circuit 100 and to the circuit board 200. In the explanation hereunder, in the plunger that is brought into contact with the semiconductor integrated circuit 100, the side facing the semiconductor integrated circuit 100 will be referred to as a tip-end side, and the side facing the opposite side of the semiconductor integrated circuit 100 in the axial line direction will be referred to as a base-end side. Furthermore, in the plunger that is brought into contact with the circuit board 200, the side facing the circuit board 200 will be referred to as a tip-end side, and the side facing the opposite side of the circuit board 200 in the axial line direction will be referred to as a base-end side.

The first plunger 21 is movable in the axial line direction by the extension and the contraction of the spring member 23, and is biased in a direction toward the semiconductor integrated circuit 100 and is brought into contact with the electrode of the semiconductor integrated circuit 100 by the elastic force of the spring member 23. The second plunger 22 is also movable in the axial line direction by the extension and the contraction of the spring member 23, and is biased toward the circuit board 200 and is brought into contact with the electrode of the circuit board 200 by the elastic force of the spring member 23.

The spring member 23 has a tightly wound portion 23a on the side of the first plunger 21, and has a sparsely wound portion 23b on the side of the second plunger 22. While the end of the tightly wound portion 23a is coupled to the base-end side of the first plunger 21, the end of the sparsely wound portion 23b is coupled to the second plunger 22. The first plunger 21 and the second plunger 22 are engaged with the spring member 23 by the winding force of the spring, and/or joined with the spring member 23 by soldering.

The first grounding probe 5 has the same structure as the signal probe 2. Specifically, the first grounding probe 5 is made of a conductive material, and includes a first plunger 51 that is brought into contact with a grounding electrode of the semiconductor integrated circuit 100 during a test of the semiconductor integrated circuit 100; a second plunger 52 that is brought into contact with a grounding electrode of the circuit board 200; and a spring member 53 that is provided between the first plunger 51 and the second plunger 52, and that couples the first plunger 51 and the second plunger 52 in an extendable and contractible manner. The first plunger 51, the second plunger 52, and the spring member 53 making up the first grounding probe 5 share the same axial line.

The spring member 53 has a tightly wound portion 53a on the side of the first plunger 51, and has a sparsely wound portion 53b on the side of the second plunger 52. While the end of the tightly wound portion 53a is coupled to the base-end side of the first plunger 51, the end of the sparsely wound portion 53b is coupled to the second plunger 52. Furthermore, the first plunger 51 and the second plunger 52 are engaged with the spring member 53 by the winding force of the spring, and/or joined with the spring member 53 by soldering.

The second grounding probe 6 has the same structure as the first grounding probe 5, except that the second grounding probe 6 has a different length in the axial line direction, and that the tip-end structure of a plunger is partly different. Specifically, the second grounding probe 6 includes a first plunger 61 that is made of a conductive material, and that is electrically connected to the first plunger 51 of the first grounding probe 5 via a connecting member 7; a second plunger 62 that is made of a conductive material, and that is electrically connected to the second plunger 52 of the first grounding probe 5 via another connecting member 7; and a spring member 63 that is provided between the first plunger 61 and the second plunger 62, and that couples the first plunger 61 and the second plunger 62 in an extendable and contractible manner. The first plunger 61, the second plunger 62, and the spring member 63 making up the second grounding probe 6 share the same axial line.

The spring member 63 has a tightly wound portion 63a on the side of the first plunger 61, and has a sparsely wound portion 63b on the side of the second plunger 62. While the end of the tightly wound portion 63a is coupled to the base-end side of the first plunger 61, the end of the sparsely wound portion 63b is coupled to the second plunger 62. The first plunger 61 and the second plunger 62 are engaged with the spring member 63 by the winding force of the spring, and/or joined with the spring member 63 by soldering.

In this first embodiment, the number of the second grounding probes 6 and the positions where the second grounding probes 6 are installed are determined in such a manner that, considering the signal probe 2, the first grounding probe 5, and the second grounding probe 6 as one transmission channel, a characteristic impedance of the transmission channel is adjusted to a preset value (e.g., 50Ω). For example, a designed number of, e.g. four to eight, second grounding probes 6 are arranged at an equal interval around the signal probe 2. Depending on the characteristic impedance to be achieved by the adjustment, the second grounding probes 6 may be arranged at unequal intervals.

The probe holder 3 is made of an insulating material such as resin, machinable ceramic, or silicone, and is made from a stack of a first member 31 positioned on the top surface side and a second member 32 positioned on the bottom surface side in FIG. 2. The first member 31 and the second member 32 have the same number of holder holes 33 and 34, respectively, for housing the signal probes 2. The holder hole 33 and the holder hole 34 for housing a signal probe 2 are provided in such a manner that the axial lines thereof match each other. The positions where the holder holes 33 and 34 are provided are determined based on the pattern of wirings for the test signals, provided on the semiconductor integrated circuit 100.

Each of the holder holes 33 and 34 has a shape of a stepped hole having different diameters in a penetrating direction. In other words, the holder hole 33 has a small diameter portion 33a having an opening on the top end surface of the probe holder 3, and a large diameter portion 33b having a diameter larger than the small diameter portion 33a. The holder hole 34 has a small diameter portion 34a having an opening on the bottom end surface of the probe holder 3, and a large diameter portion 34b having a diameter larger than the small diameter portion 34a. The shapes of the holder holes 33 and 34 are determined based on the structure of the signal probe 2 to be housed therein. The first plunger 21 has a function for preventing the signal probe 2 from coming out from the probe holder 3, by having a flange that is brought into abutment against a wall surface at a boundary between the small diameter portion 33a and the large diameter portion 33b of the holder hole 33. The second plunger 22 has a function for preventing the signal probe 2 from coming out from the probe holder 3, by having a flange that is brought into abutment against a wall surface at a boundary between the small diameter portion 34a and the large diameter portion 34b of the holder hole 34.

The first member 31 and the second member 32 have the same number of holder holes 35 and the holder holes 36, respectively, for housing a plurality of the first grounding probes 5. The holder holes 35 and 36 for housing a first grounding probe 5 are provided in such a manner that the axial lines thereof match each other. The positions where the holder holes 35 and 36 are provided are determined based on the pattern of grounding wirings provided on the semiconductor integrated circuit 100. The holder hole 35 has a shape of a stepped hole having different diameters in the penetrating direction, in the same manner as the holder hole 33 described above, and has a small diameter portion 35a having an opening on the top end surface of the probe holder 3, and a large diameter portion 35b having a diameter larger than the small diameter portion 35a. The holder hole 36 also has a shape of a stepped hole having different diameters in the penetrating direction, in the same manner as holder hole 34 described above, and has a small diameter portion 36a having an opening on the bottom end surface of the probe holder 3, and a large diameter portion 36b having a diameter larger than the small diameter portion 36a.

The first member 31 and the second member 32 also have the same number of holder holes 37 and holder holes 38, respectively, for housing a plurality of the second grounding probes 6. The holder holes 37 and 38 for housing a second grounding probe 6 are provided in such a manner that the axial lines thereof match each other. The positions where the holder holes 37 and 38 are provided are determined based on the positions where the second grounding probes 6 are installed. The holder holes 37 and 38 have a hole shape extending at a uniform diameter along the penetrating direction. In this first embodiment, the holder hole 37 and the holder hole 38 are provided correspondingly to each of the second grounding probes 6. Among the holder holes 37 provided in plurality, a holder hole 37 positioned nearest to the holder hole 35 has a portion communicating with the holder hole 35, and a part (a stretching portion 72, which is described later) of the connecting member 7 is fitted in the communicating portion. For the holder holes 38, too, among the holder holes 38 provided in plurality, a holder hole 38 positioned nearest to the holder hole 36 has a portion communicating with the holder hole 36, and the stretching portion 72 of another connecting member 7 is fitted in the communicating portion. The holder hole 37 and the holder hole 38 may have a shape of a ring-like hole in which all of the second grounding probes 6 can be housed. The holder hole 37 and the holder hole 38 may also be provided with a stepped shape, in the same manner as the holder holes 33 to 36, so that the second grounding probes 6 are prevented from coming out.

Figure 3:
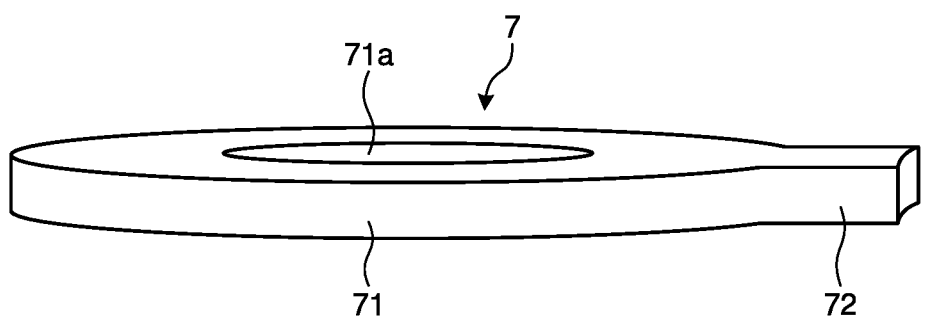
FIG. 3 is a schematic illustrating a structure of a connecting member included in the probe unit according to the first embodiment of the present invention.

FIG. 3 is a schematic illustrating a structure of the connecting member included in the probe unit according to the first embodiment of the present invention. The connecting member 7 is made of a conductive material. The connecting member 7 has a disk-like shape with an orifice, and has a disk portion 71 that is brought into contact with the second grounding probe 6 on one surface thereof, and a stretching portion 72 that stretches from a part of the side surface of the disk portion 71, and that has an end, in the stretching direction, with which the first grounding probe 5 is brought into contact. The disk portion 71 and the stretching portion 72 provide a base portion. A signal probe 2 and a part of the probe holder 3 are passed through an orifice 71a of the disk portion 71. The connecting member 7 is provided to each of the tip-end side of the first plunger 61 and the tip-end side of the second plunger 62, as illustrated in FIG. 2, in the probe holder 3. When the second grounding probes 6 are housed in the probe holder 3, the second grounding probes 6 are pressed against each of the connecting members 7 that are provided on both ends.

The surface of the connecting member 7 on the side opposite to the surface with which the second grounding probe 6 is brought into contact (the surface facing the semiconductor integrated circuit 100 or the circuit board 200) is exposed to the external. It is preferable to provide insulating films on a surface of the connecting member 7 provided on the first plunger side, and a surface of the connecting member 7 provided on the second plunger side, the surfaces being those facing the semiconductor integrated circuit 100 and the circuit board 200, respectively.

Figure 4:
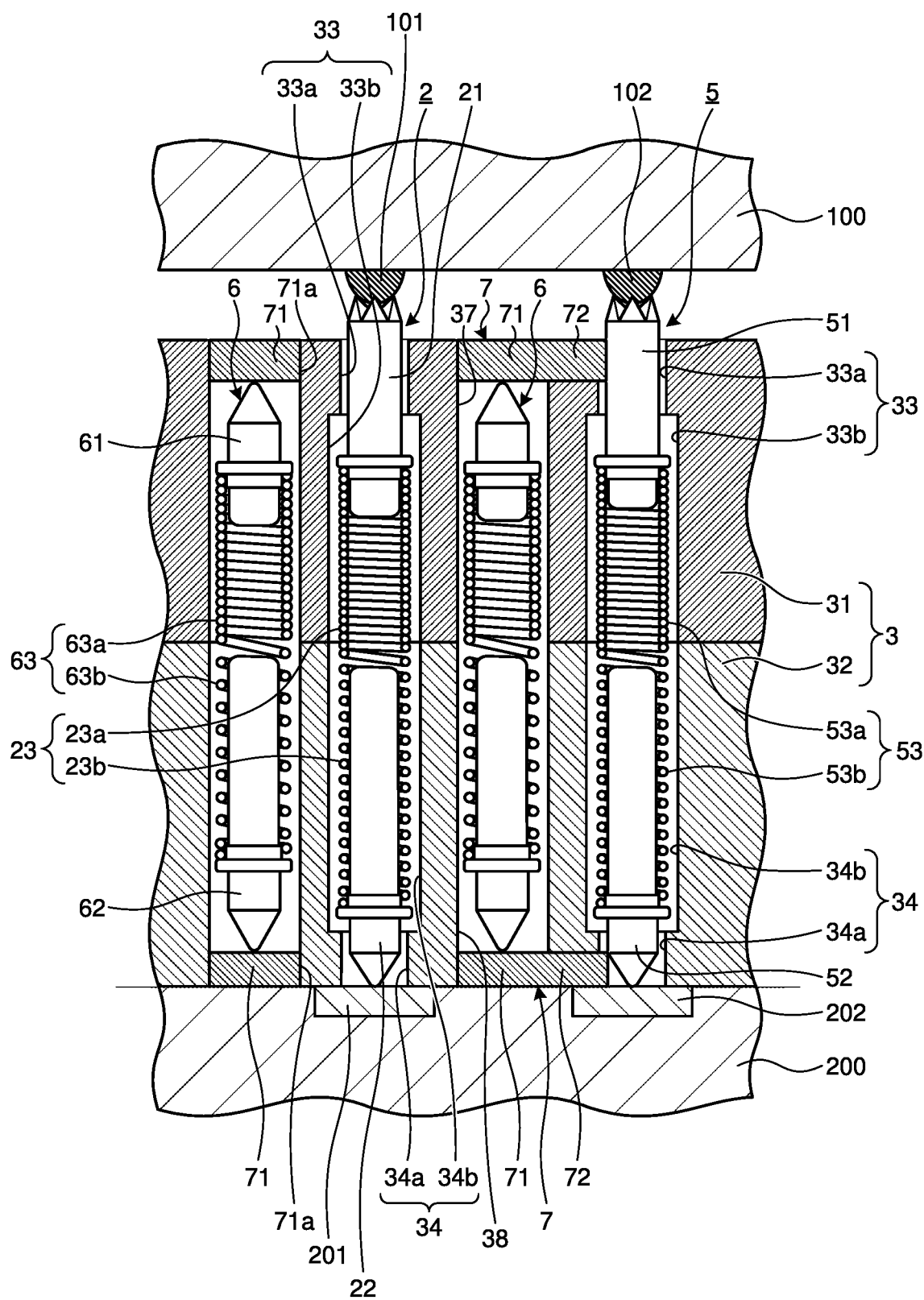
FIG. 4 is a schematic illustrating a configuration during a test of a semiconductor integrated circuit, using a probe holder according to the first embodiment of the present invention.

FIG. 4 is a schematic illustrating a configuration during a test of the semiconductor integrated circuit 100, using the probe holder 3. During a test, the first plunger 21 of the signal probe 2 is brought into contact with an electrode 101 for test signals, provided on the semiconductor integrated circuit 100, and the second plunger 22 is brought into contact with an electrode 201 for the test signals, provided on the circuit board 200. The first plunger 51 of the first grounding probe 5 is then brought into contact with an electrode 102 for grounding, provided on the semiconductor integrated circuit 100, and the second plunger 52 is brought into contact with an electrode 202 for grounding, provided on the circuit board 200. With this configuration, each of the second grounding probes 6 is electrically connected to the external ground, via the connecting member 7 and the first grounding probe 5.

During a test of the semiconductor integrated circuit 100, the spring members 23, 53 are compressed in the longitudinal direction, by a contact load applied by the semiconductor integrated circuit 100. When the spring member 23 becomes compressed, the tightly wound portion 23a of the signal probe 2 is brought into contact with the base-end side of the second plunger 22, as illustrated in FIG. 4. As a result, more reliable electrical conduction is achieved. At this time, because the base-end side of the second plunger 22 is moved below the tightly wound portion 23a, the axial line of the second plunger 22 is not misaligned by a large degree. When the spring member 53 becomes compressed, the tightly wound portion 53a of the first grounding probe 5 is brought into contact with the base-end side of the second plunger 52. As a result, more reliable electrical conduction is achieved.

A test signal supplied from the circuit board 200 to the semiconductor integrated circuit 100 during the test travels from the electrode 201 on the circuit board 200, and reaches the electrode 101 on the semiconductor integrated circuit 100 via the second plunger 22, the tightly wound portion 23a, and the first plunger 21 of the signal probe 2. In this manner, in the signal probe 2, because the first plunger 21 becomes conductive with the second plunger 22 via the tightly wound portion 23a, the channel for conducting the electric signal can be minimized. Therefore, it is possible to prevent a signal from being conducted to the sparsely wound portion 23b during a test, so that the resistance and the inductance can be reduced.

Generally, it is known that, in an electronic circuit that handles alternating current signals, the signals are reflected at a position where wirings with different impedances are connected to each other, by an amount corresponding to the ratio of the difference in the impedance, and the propagation of the signal is obstructed thereby. The same principle applies to a relation between the semiconductor integrated circuit 100 and the signal probe 2 that are to be used. Therefore, when the semiconductor integrated circuit 100 has a characteristic impedance that is very much different from that of the signal probe 2, a loss in the electric signal occurs, and the waveform of the electric signal becomes distorted.

It is also known that the ratio of the signal reflected at the position of the connection, being reflected due to the difference in the characteristic impedance, increases when the electrical length of the signal probe 2 (the length of a propagation channel with respect to the cycle of the electric signal) is increased. In other words, in the probe unit 1 according to this first embodiment, the ratio of the reflected electric signal increases when the processing speed, that is, the frequency of the semiconductor integrated circuit 100 becomes higher. Therefore, when fabricated is a probe unit 1 for supporting the semiconductor integrated circuit 100 driven at a high frequency, it is important to match the characteristic impedance of the signal probe 2 to that of the semiconductor integrated circuit 100, that is, it is important to perform what is called impedance matching highly accurately.

However, it is not easy to change the shape and the like of the signal probe 2, from the viewpoint of the impedance matching. Because the signal probe 2 has inherent limitations, e.g., having an external diameter reduced to a size equal to or less than 1 millimeter, and a complicated shape including the first plunger 21, the second plunger 22, and the spring member 23, it is difficult to change the shape of the signal probe 2 to a shape suitable for the impedance matching, from the viewpoints of designing and manufacturing.

Therefore, used in this first embodiment is a configuration in which the characteristic impedance is adjusted by disposing the second grounding probes 6 around the signal probe 2, without changing the structure of the signal probe 2. By using such a configuration, a conventional structure of the signal probe 2 can be used as it is.

In the first embodiment described above, the second grounding probes 6 are arranged around the signal probe 2, and are connected to the external ground via the connecting members 7 and the first grounding probes 5. In this manner, in this first embodiment, unlike the conventional configuration in which the contact probes for signals and those for grounding are arranged in a lattice-like arrangement, the impedance can be adjusted, without increasing the pitch between the adjacent signal probes 2. According to the first embodiment, it is possible to improve the freedom in the design of the pitch and the arrangement of the signal probes 2, compared with that in the conventional configuration in which the contact probes for signals and those for grounding are arranged in a lattice-like arrangement.

First Modification of First Embodiment

Figure 5:
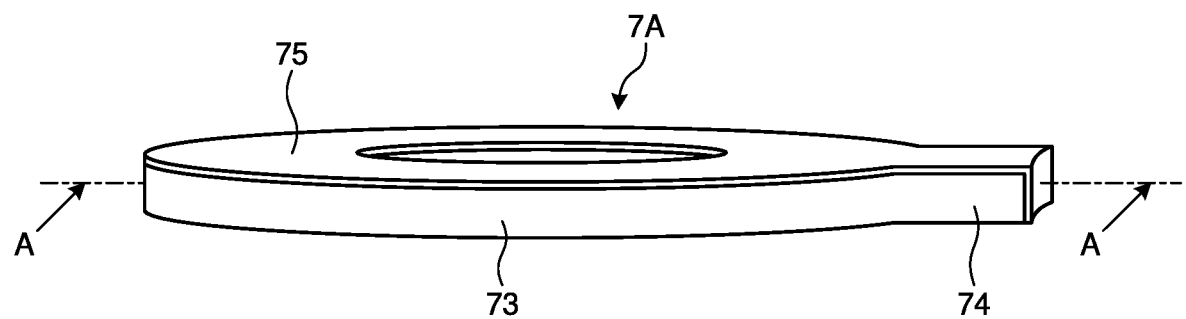
FIG. 5 is a schematic illustrating a structure of a connecting member included in a probe unit according to a first modification of the first embodiment of the present invention.
Figure 6:
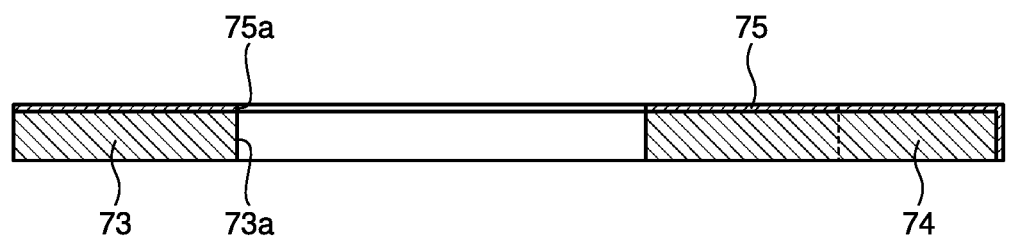
FIG. 6 is a sectional view across the line A-A in FIG. 5.

FIG. 5 is a schematic illustrating a structure of a connecting member included in a probe unit according to a first modification of the first embodiment of the present invention. FIG. 6 is a sectional view across the line A-A in FIG. 5. This connecting member 7A according to the first modification includes an insulating disk portion 73 that has a disk shape with an orifice, an insulating stretching portion 74 that stretches from a part of the side surface of the disk portion 73, and a conductive film 75 that is provided across a surface of the disk portion 73 on the side on which the second grounding probe 6 is installed, and to a surface of the stretching portion 74 facing the first grounding probe 5. An orifice 73a of the disk portion 73 is communicated with an opening 75a of the conductive film 75. The signal probe 2 and a part of the probe holder 3 are passed through the hole formed by the orifice 73a and the opening 75a (see FIG. 2, for example).

The connecting member 7A is provided to each of the tip-end side of the first plunger 61 and the tip-end side of the second plunger 62, in the probe holder 3. At this time, the conductive films 75 of these two connecting members 7A that are installed in the probe holder 3 face each other. In this first modification, the first grounding probe 5 and the second grounding probes 6 are brought into contact with the conductive films 75 on the respective connecting members 7A. The second grounding probes 6 are electrically connected to the first grounding probe 5 via the conductive films 75, and are also electrically connected to the external ground via the first grounding probe 5.

Second Modification of First Embodiment

Figure 7:
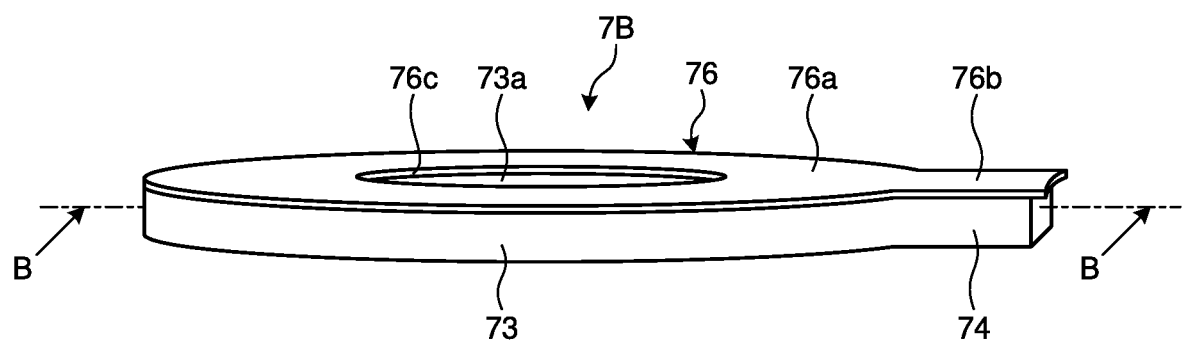
FIG. 7 is a schematic illustrating a structure of a connecting member included in a probe unit according to a second modification of the first embodiment of the present invention.
Figure 8:
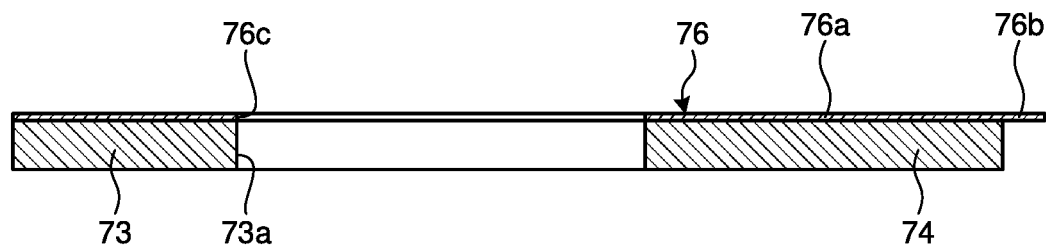
FIG. 8 is a sectional view across the line B-B in FIG. 7.

FIG. 7 is a schematic illustrating a structure of a connecting member included in a probe unit according to a second modification of the first embodiment of the present invention. FIG. 8 is a sectional view across the line B-B in FIG. 7. This connecting member 7B according to the second modification has the insulating disk portion 73 that has a disk shape with an orifice, the insulating stretching portion 74 that stretches from a part of the side surface of the disk portion 73, and a conductive plate 76 that is provided to the surface of the disk portion 73 on the side on which the second grounding probe 6 is installed.

The conductive plate 76 is a plate-like member made of a conductive material. The conductive plate 76 includes a disk portion 76a that has a disk shape with an orifice, the disk shape being corresponding to the shape of the disk portion 73, and a protruding portion 76b that stretches along the stretching portion 74 from a part of the side surface of the disk portion 76a, and that has an end protruding further than the end of the stretching portion 74, toward the side opposite to the side continuing to the disk portion 76a.

The orifice 73a of the disk portion 73 is communicated with an opening 76c of the conductive plate 76. The signal probe 2 and a part of the probe holder 3 are passed through the hole formed by the orifice 73a and the opening 76c (see FIG. 2, for example).

The connecting member 7B is provided to each of the tip-end side of the first plunger 61 and the tip-end side of the second plunger 62, in the probe holder 3. At this time, the conductive plates 76 of these two connecting members 7B that are installed in the probe holder 3 face each other. In this second modification, the first grounding probe 5 and the second grounding probes 6 are brought into contact with the conductive plates 76 on the connecting members 7B. The first grounding probe 5 is brought into contact with the protruding portions 76b. Each of the second grounding probes 6 is electrically connected to the first grounding probe 5 via the conductive plates 76, and is electrically connected to the external ground via the first grounding probe 5.

Third Modification of First Embodiment

Figure 9:
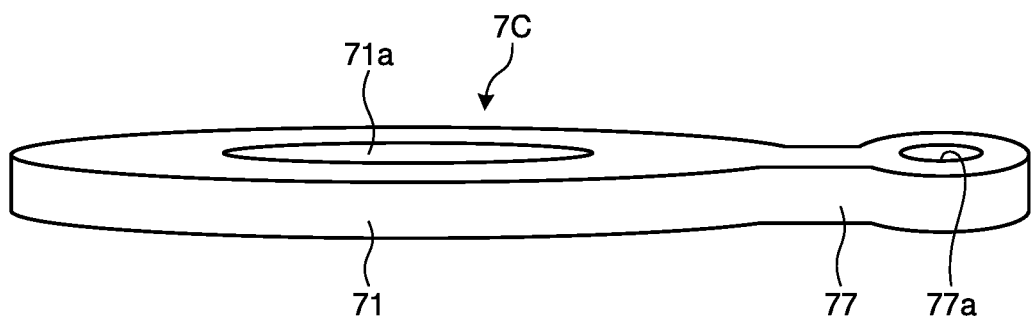
FIG. 9 is a schematic illustrating a structure of a connecting member included in a probe unit according to a third modification of the first embodiment of the present invention.

FIG. 9 is a schematic illustrating a structure of a connecting member included in a probe unit according to a third modification of the first embodiment of the present invention. Explained in the first embodiment and the first modification described above is an example in which the first plunger 51 or the second plunger 52 is brought into abutment against an end of the stretching portion 72. However, in the third modification, the part that is brought into contact with the first plunger 51 or the second plunger 52 has a hole shape. This connecting member 7C has a conductive disk portion 71 that has a disk shape with an orifice, and a conductive stretching portion 77 that stretches from a part of the side surface of the disk portion 71. The stretching portion 77 is provided with an insertion hole 77a through which the first plunger 51 or the second plunger 52 can be inserted. For example, when the first plunger 51 is passed through the insertion hole 77a, by bringing a part of the first plunger 51 into contact with a part of the inner wall of the insertion hole 77a, the connecting member 7C is electrically connected to the first grounding probe 5.

Fourth Modification of First Embodiment

Figure 10:
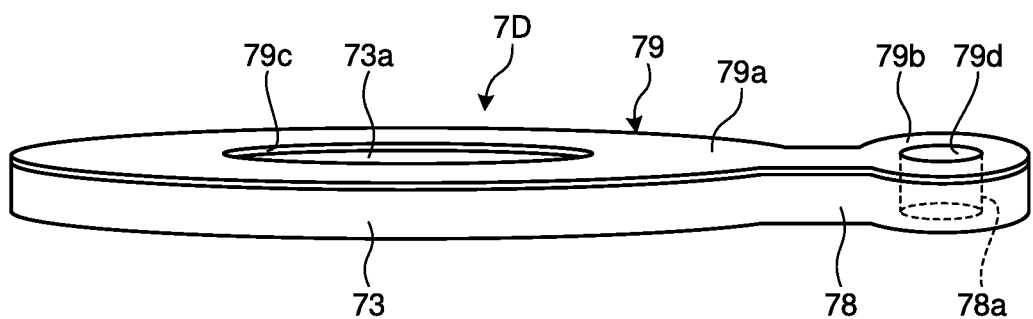
FIG. 10 is a schematic illustrating a structure of a connecting member included in a probe unit according to a fourth modification of the first embodiment of the present invention.

FIG. 10 is a schematic illustrating a structure of a connecting member included in a probe unit according to a fourth modification of the first embodiment of the present invention. This fourth modification presents a configuration in which the stretching portion 77 according to the third modification described above is applied to the first modification. A connecting member 7D according to the fourth modification has the insulating disk portion 73 that has a disk shape with an orifice, an insulating stretching portion 78 that stretches from a part of the side surface of the disk portion 73, and a conductive plate 79 that is provided on the surface of the disk portion 73 on the side on which the second grounding probe 6 is installed. The stretching portion 78 has an insertion hole 78a through which the first plunger 51 or the second plunger 52 can be inserted.

The conductive plate 79 is made of a conductive material. The conductive plate 79 has a disk portion 79a that has a disk shape with an orifice, correspondingly to the shape of the disk portion 73, and a covering portion 79b that extends from a part of the side surface of the disk portion 79a along the stretching portion 78, and that covers the inner wall surface of the insertion hole 78a.

The orifice 73a of the disk portion 73 and an opening 79c of the conductive plate 79 are communicated with each other. The signal probe 2 and a part of the probe holder 3 are passed through the hole formed by the orifice 73a and the opening 79c (see FIG. 2, for example). The covering portion 79b has an insertion hole 79d through which the first plunger 51 or the second plunger 52 can be inserted.

The connecting member 7D is provided to each of the tip-end side of the first plunger 61 and the tip-end side of the second plunger 62, in the probe holder 3. At this time, the conductive plates 79 of these two connecting members 7D installed in the probe holder 3 face each other. In this fourth modification, the first grounding probe 5 is brought into contact with the covering portion 79b that covers the surface of the insertion hole 78a. Each of the second grounding probes 6 is electrically connected to the first grounding probe 5 via the disk portion 79a of the conductive plate 79, and is electrically connected to the external ground via the first grounding probe 5.

The two connecting members provided to the probe holder 3 may be a combination of any two of the connecting members 7, 7A, 7B, 7C, 7D described above. For example, one of the two connecting members may be the connecting member 7, and the other may be the connecting member 7A.

Second Embodiment

Figure 11:
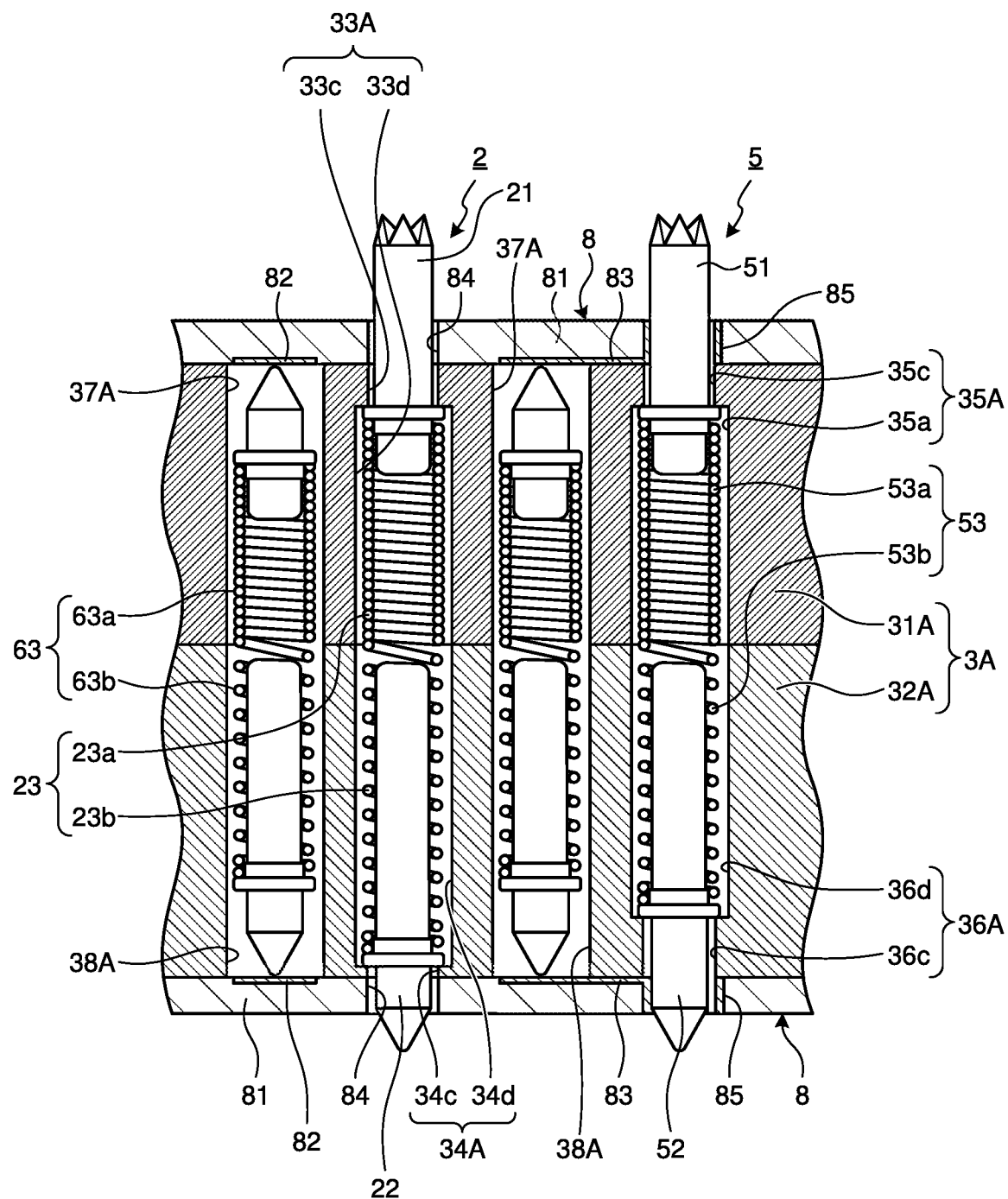
FIG. 11 is a partial sectional view illustrating a structure of a relevant portion of a probe unit according to a second embodiment of the present invention.
Figure 12:
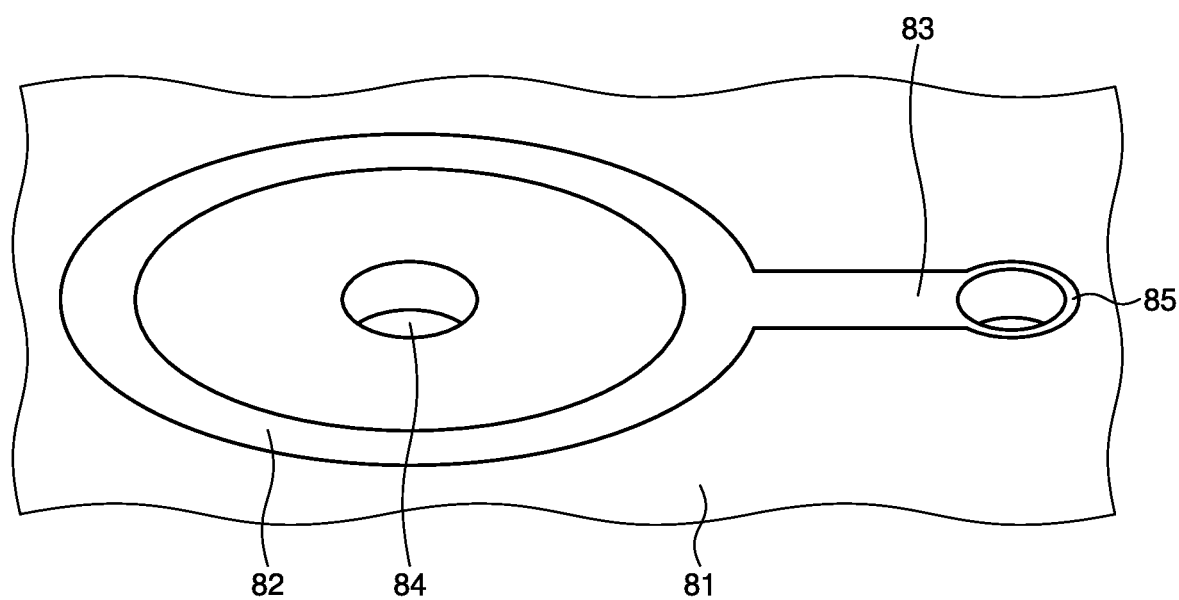
FIG. 12 is a schematic illustrating a structure of a connecting member included in the probe unit according to the second embodiment of the present invention.

FIG. 11 is a partial sectional view illustrating a structure of a relevant portion of a probe unit according to a second embodiment of the present invention. FIG. 12 is a schematic illustrating a structure of a connecting member included in the probe unit according to the second embodiment of the present invention. The probe unit according to the second embodiment includes the signal probe 2, the first grounding probe 5, and the second grounding probes 6, described above; a probe holder 3A that houses and holds a plurality of contact probes in a predetermined pattern; a connecting member 8 that is stacked on each of the top surface and the bottom surface of the probe holder 3A; and the holder member 4 that is provided around the probe holder 3A and the connecting members 8, and that suppresses a displacement of the semiconductor integrated circuit 100 being brought into contact with the signal probes 2 and the first grounding probe 5 during a test.

The probe holder 3A is made from a first member 31A and a second member 32A that are stacked sequentially from the top surface side in FIG. 11, in the order listed herein. The connecting member 8 (a first plate portion and a second plate portion) is stacked on each of the top surface and the bottom surface of the probe holder 3A.

The first member 31A and the second member 32A are made of an insulating material such as resin, machinable ceramic, or silicone.

The connecting member 8 includes a main body 81 that is made of an insulating material such as resin, machinable ceramic, or silicone; a first conductive portion 82 that is conductive, that forms a part of a surface of the connecting member 8, together with a surface of the main body 81, and that is brought into contact with the second grounding probe 6; and a second conductive portion 83 that is conductive, that extends from the first conductive portion 82, that forms a part of a surface of the connecting member 8, together with a surface of the main body 81, and that is brought into contact with the first grounding probe 5. The first conductive portion 82 and the second conductive portion 83 are a conductive film provided to the surface of the main body 81 that is the base portion.

The first member 31A, the second member 32A, and the connecting member 8 have the same number of holder holes 33A, holder holes 34A, and holder holes 84, respectively, for housing the signal probes 2.

The first member 31A, the second member 32A, and the connecting member 8 have the same number of holder holes 35A, holder holes 36A, and holder holes 85, respectively, for housing the first grounding probe 5. The holder hole 85 is achieved by covering the wall surface of the insertion hole provided to the main body 81, with the second conductive portion 83.

Each of the holder holes 33A, 34A, 35A, and 36A has a shape of a stepped hole having different diameters in the penetrating direction. In other words, the holder hole 33A has a small diameter portion 33c having an opening on the side of the top end surface of the probe holder 3A, and a large diameter portion 33d having a diameter larger than the small diameter portion 33c. The holder hole 34A has a small diameter portion 34c having an opening on the side of the bottom end surface of the probe holder 3A, and a large diameter portion 34d having a diameter larger than the small diameter portion 34c. The holder hole 35A has a small diameter portion 35a having an opening on the side of the top end surface of the probe holder 3A, and a large diameter portion 35b having a diameter larger than the small diameter portion 35a. The holder hole 36A has a small diameter portion 36a having an opening on the side of the bottom end surface of the probe holder 3A, and a large diameter portion 36b having a diameter larger than the small diameter portion 36a. The holder hole 84 is communicated with the small diameter portion 33c or the small diameter portion 34c. The holder hole 85 is communicated with the small diameter portion 35a or the small diameter portion 36a.

The first member 31A and the second member 32A have the same number of holder holes 37A and holder holes 38A, respectively, for housing the second grounding probes 6. The holder hole 37A and the holder hole 38A are provided in such a manner that the axial lines thereof match each other.

In the second embodiment described above, the second grounding probes 6 are arranged around the signal probe 2, and are configured to be connected to the external ground via the conductive portions (the first conductive portion 82 and the second conductive portion 83) of the connecting member 8, and via the first grounding probe 5. In this manner, in this second embodiment, too, the impedance can be adjusted. According to the second embodiment, it is possible to improve the freedom in the design of the pitch and the arrangement of the signal probes 2, compared with the conventional configuration in which the contact probes for signals and those for grounding are arranged in a lattice-like arrangement.

Third Embodiment

Figure 13:
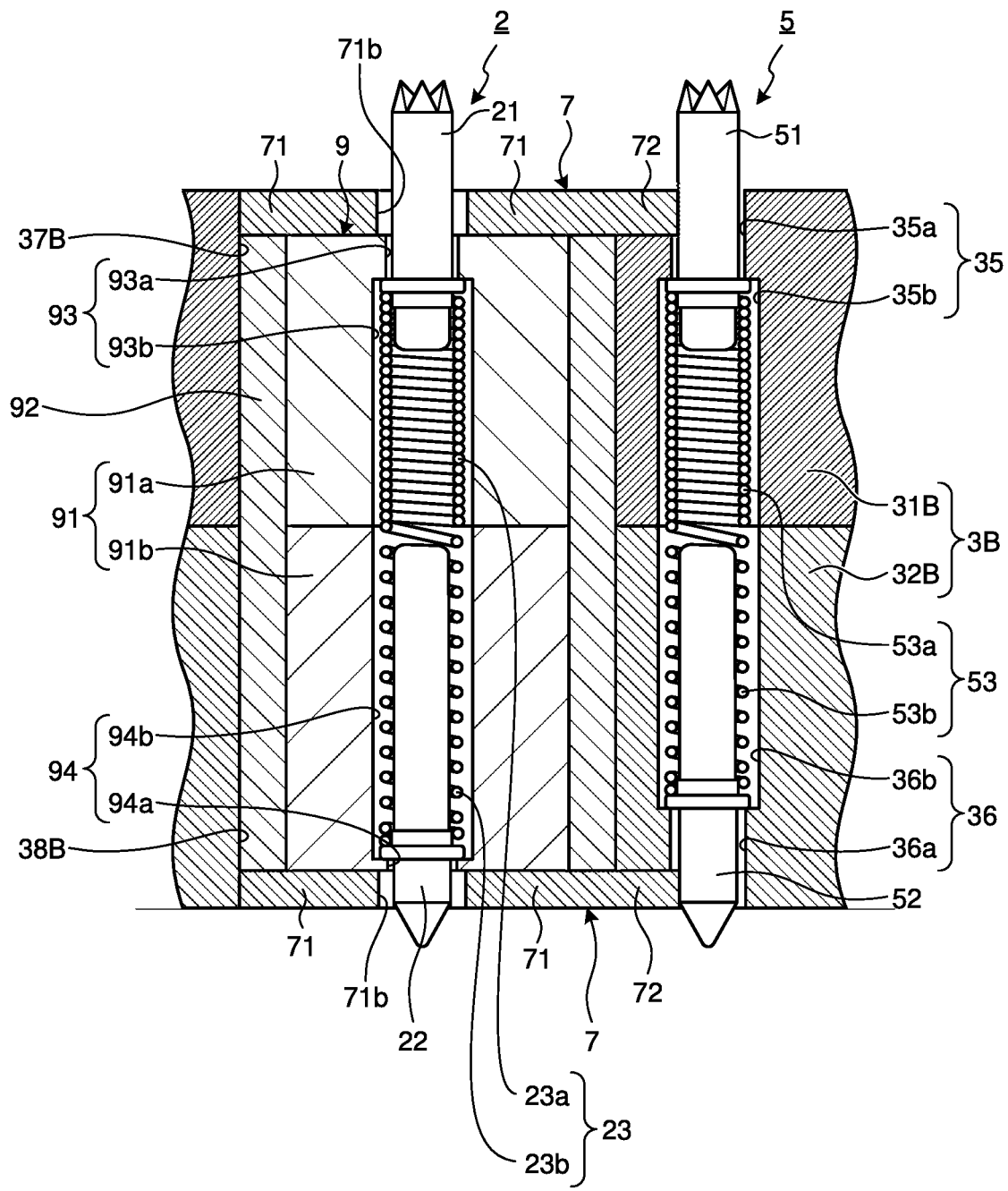
FIG. 13 is a partial sectional view illustrating a structure of a relevant portion of a probe unit according to a third embodiment of the present invention.

FIG. 13 is a partial sectional view illustrating a structure of a relevant portion of a probe unit according to a third embodiment of the present invention. Explained in the first and the second embodiments described above is an example in which the impedance is adjusted using the second grounding probes 6, but in this third embodiment, the impedance is adjusted using a connection pipe 9.

The probe unit according to the third embodiment includes the signal probes 2, the first grounding probe 5, and the connecting member 7 that are described above; a probe holder 3B that houses and holds a plurality of contact probes in a predetermined pattern; the holder member 4 that is provided around the probe holder 3B, and that suppresses a displacement of the semiconductor integrated circuit 100 being brought into contact with the signal probes 2 and the first grounding probe 5 during a test; and a connection pipe 9 that is electrically connected to the first grounding probe 5 via the connecting member 7. In the explanation below, it is assumed herein that the disk portion 71 of the connecting member 7 according to the third embodiment has an orifice 71b having a diameter smaller than that of the orifice 71a described above. Specifically, the orifice 71b has a diameter larger than small diameter portions of an insulating pipe 91 (small diameter portions 93a and 94a, which will be described later), and smaller than the inner diameter of a conductive pipe 92 which will be described later.

The probe holder 3B is made of an insulating material such as resin, machinable ceramic, or silicone, and is made from a stack of a first member 31B positioned on the top surface side and a second member 32B positioned on the bottom surface side in FIG. 13. The first member 31B and the second member 32B have the same number of the holder holes 35 and holder holes 36, respectively, for housing the first grounding probes 5.

The first member 31B and the second member 32B are also provided with the same number of holder holes 37B and holder holes 38B, respectively, for housing a plurality of the connection pipes 9. The holder holes 37B and 38B for housing a connection pipe 9 are provided in such a manner that the axial lines thereof match each other. The positions where the holder holes 37B and 38B are provided are determined based on the pattern of wirings for the test signals, provided on the semiconductor integrated circuit 100.

The holder holes 37B and 38B both have a hole shape having a uniform diameter in the penetrating direction. The holder hole 35 and the holder hole 37B are partly communicated with each other on the top surface side, and the stretching portion 72 of the connecting member 7 is fitted in the communicating portion. In the holder hole 38B, too, the holder hole 36 and the holder hole 38B are partly communicated with each other on the bottom surface side, and the stretching portion 72 of another connecting member 7 is fitted in the communicating portion. The shapes of the holder holes 373 and 38B are determined based on the structure of the connection pipe 9 that is housed therein. The top surface side of the holder hole 37B and the bottom surface side of the holder hole 39B may be provided with a stepped shape so that the connection pipe 9 is prevented from coming out.

The connection pipe 9 includes a tubular insulating pipe 91 through which the signal probe 2 is passed, and a conductive pipe 92 that is provided on the outer circumference of the insulating pipe 91.

The insulating pipe 91 is made of an insulating material such as fluorine-based resin (e.g., polytetrafluoroethylene), and is made of a stack of a first member 91a positioned on the top surface side and a second member 91b positioned on the bottom surface side in FIG. 13. The first member 91a and the second member 92a have holder holes 93 and 94, respectively, for housing a signal probe 2. The holder holes 93 and 94 for housing a signal probe 2 are provided in such a manner that the axial lines thereof match each other.

The holder holes 93 and 94 both have a shape of a stepped hole having different diameters in the penetrating direction. In other words, the holder hole 93 has a small diameter portion 93a having an opening on the top end surface of the insulating pipe 91, and a large diameter portion 93b having a diameter larger than the small diameter portion 93a. The holder hole 94 has a small diameter portion 94a having an opening on the bottom end surface of the insulating pipe 91, and a large diameter portion 94b having a diameter larger than the small diameter portion 94a. The shapes of the holder holes 93 and 94 are determined based on the structure of the signal probe 2 to be housed therein. The first plunger 21 has a function for preventing the signal probe 2 from coming out from the probe holder 3B, by having a flange that is brought into abutment against a wall surface at a boundary between the small diameter portion 93a and the large diameter portion 93b of the holder hole 93. The second plunger 22 has a function for preventing the signal probe 2 from coming out the probe holder 3B, by having a flange that is brought into abutment against a wall surface at a boundary between the small diameter portion 94a and the large diameter portion 94b of the holder hole 94.

The conductive pipe 92 is made of a conductive material such as copper, silver, and alloy or plating containing copper or silver as a main component. The conductive pipe 92 covers the outer circumferential surface of the insulating pipe 91. The conductive pipe 92 is brought into contact with the connecting members 7, and is electrically connected to the first grounding probe 5 via the connecting members 7. The conductive pipe 92 may be made from two members, in the same manner as the insulating pipe.

In this third embodiment, the material, the inner diameter, and the like of the conductive pipe 92 are determined, considering the signal probe 2, the first grounding probe 5, and the connection pipe 9 as one transmission channel, in such a manner that the characteristic impedance of the transmission channel is brought to a preset value (e.g., 50Ω).

In the third embodiment explained above, the connection pipe 9 is disposed around the signal probe 2, and is connected to the external ground via the connecting members 7 and the first grounding probe 5. With this structure, in this third embodiment, the impedance can be adjusted without increasing the pitch between the adjacent signal probes 2, unlike the conventional configuration in which the contact probes for signals and those for grounding are arranged in a lattice-like arrangement. According to the third embodiment, compared with the configuration in which the contact probes for signals and those for grounding are arranged in a lattice-like arrangement, it is possible to improve the freedom in the design of the pitch and the arrangement of the signal probes 2.

It is also possible to apply the connecting member 7 having the orifice 71b explained in the third embodiment to the configuration described in the first embodiment described above. The orifice 71b has a hole shape having a diameter that is larger than the small diameter portions 33a, 34a, and smaller than the orifice 71a. In such a case, the parts of the first member 31 and the second member 32 interfering with the disk portions 71 are cut off. Furthermore, to the connecting member 7 provided on the side of the circuit board 200, a recessed portion or an insulating film is provided so as not to interfere with the electrode 201.

First Modification of Third Embodiment

Figure 14:
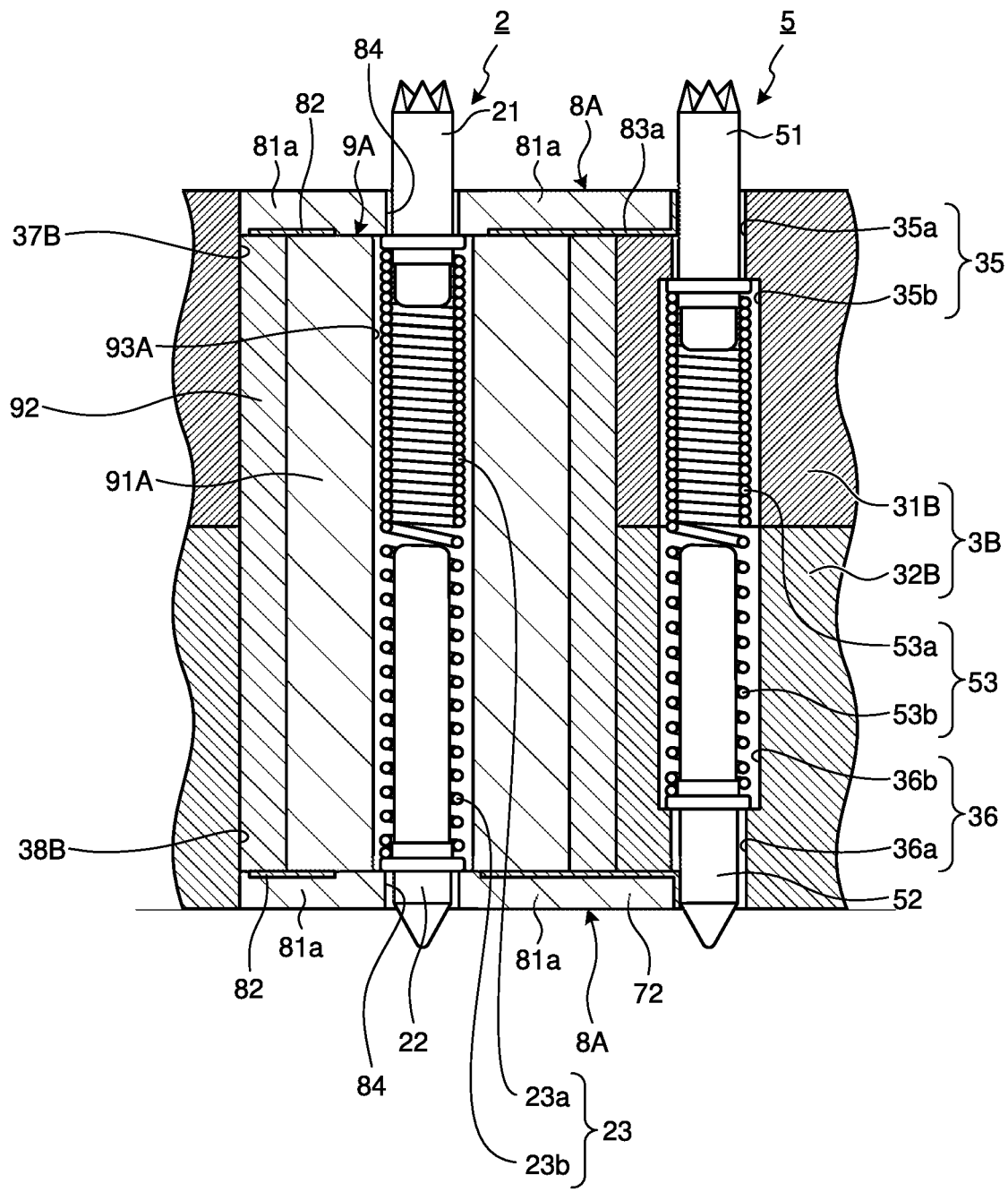
FIG. 14 is a partial sectional view illustrating a structure of a relevant portion of a probe unit according to a first modification of the third embodiment of the present invention.

FIG. 14 is a partial sectional view illustrating a structure of a relevant portion of a probe unit according to a first modification of the third embodiment of the present invention. Explained in the third embodiment described above is an example in which the connection pipe 9 prevents the signal probe 2 from coming out, but in this modification, a connecting member 8A prevents the signal probe 2 from coming out.

The probe unit according to the first modification includes the signal probes 2 and the first grounding probe 5 described above; the probe holder 3B that houses and holds a plurality of contact probes in a predetermined pattern; the connecting member 8A that is stacked on each of the top surface and the bottom surface of the probe holder 3B; the holder member 4 that is provided around the probe holder 3B, and that suppresses a displacement of the semiconductor integrated circuit 100 being brought into contact with the signal probes 2 and the first grounding probe 5 during a test; and a connection pipe 9A that is electrically connected to the first grounding probe 5 via the connecting member 8A.

The connecting member 8A has a main body 81a made of an insulating material such as resin, machinable ceramic, or silicone, the first conductive portion 82 that is conductive, that forms a part of a surface of the connecting member 8A, together with a surface of the main body 81a, and that is brought into contact with the connection pipe 9 (the conductive pipe 92 described later), and a second conductive portion 83a that is conductive, that extends from the first conductive portion 82, that forms a part of a surface of the connecting member 8A, together with a surface of the main body 81a, and that is brought into contact with the first grounding probe 5. To the connecting member 8A, holder holes 84 for housing the signal probes 2 are provided in the same number as the number of the holder holes 37B, 38B.

The connection pipe 9A includes a tubular insulating pipe 91A through which the signal probe 2 is passed, and the conductive pipe 92 provided on the outer circumference of the insulating pipe 91A.

The insulating pipe 91A is made of an insulating material such as fluorine-based resin (e.g., polytetrafluoroethylene). The insulating pipe 91A is provided with a holder hole 93A for housing the signal probe 2. The holder hole 93A for housing the signal probe 2 has a hole shape having a uniform diameter in the penetrating direction. The holder hole 93A has the same diameter as those of the large diameter portions 93b, 94b described above, for example.

The first plunger 21 has a function for preventing the signal probe 2 from coming out from the probe holder 3B, by having a flange that is brought into abutment against a wall surface at a boundary between the holder hole 84 of the connecting member 8A on the top surface side, and the holder hole 93A. Furthermore, the second plunger 22 has a function for preventing the signal probe 2 from coming out from the probe holder 3B, by having a flange that is brought into abutment against a wall surface at a boundary between the holder hole 84 of the connecting member 8A on the bottom surface side, and the holder hole 93A.

In this first modification, the insulating pipe 91A may be configured to be divided into two, in the same manner as the third embodiment described above. At this time, the conductive pipe 92 may also be configured to be divided into two.

Second Modification of Third Embodiment

Figure 15:
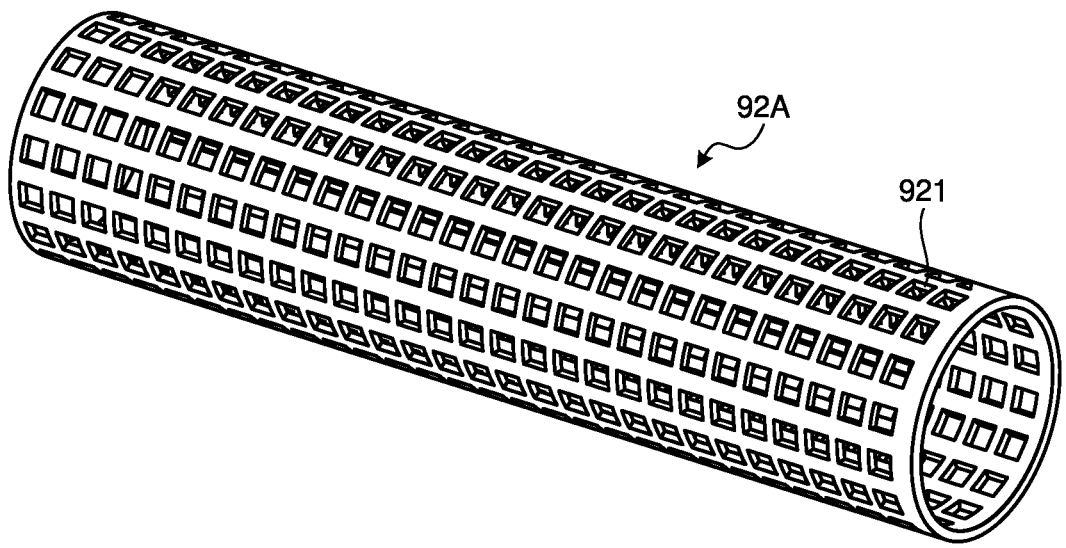
FIG. 15 is a partial sectional view illustrating a structure of a relevant portion of a probe unit according to a second modification of the third embodiment of the present invention, illustrating a structure of a conductive pipe.

FIG. 15 is a partial sectional view illustrating a structure of a relevant portion of a probe unit according to a second modification of the third embodiment of the present invention, illustrating a structure of a conductive pipe. In this second modification, a conductive pipe 92A illustrated in FIG. 15 is provided, instead of the conductive pipe 92, in the connection pipes 9, 9A according to the third embodiment and the first modification described above. The second modification has the same structure as that according to the third embodiment (or the first modification), except that the conductive pipe is replaced. Next, the conductive pipe 92A that is different from the structure described above will be explained.

The conductive pipe 92A is made of a conductive material such as copper, silver, and alloy or plating containing copper or silver as a main component. The conductive pipe 92A covers the outer circumferential surface of the insulating pipe 91 (or the insulating pipe 91A). The conductive pipe 92A is brought into contact with the connecting members 7, and is electrically connected to the first grounding probe 5 via the connecting members 7. The conductive pipe 92A may be composed of a plurality of (e.g., two) members.

The conductive pipe 92A has a plurality of through holes 921 passing through in radial directions that perpendicularly intersect with the longitudinal axis of the conductive pipe 92A. The through holes 921 are arranged in the longitudinal axial direction, and the circumferential direction of the conductive pipe 92A. The conductive pipe 92A has a mesh-like surface on which the through holes 921 are arranged regularly.

Third Modification of Third Embodiment

Figure 16:
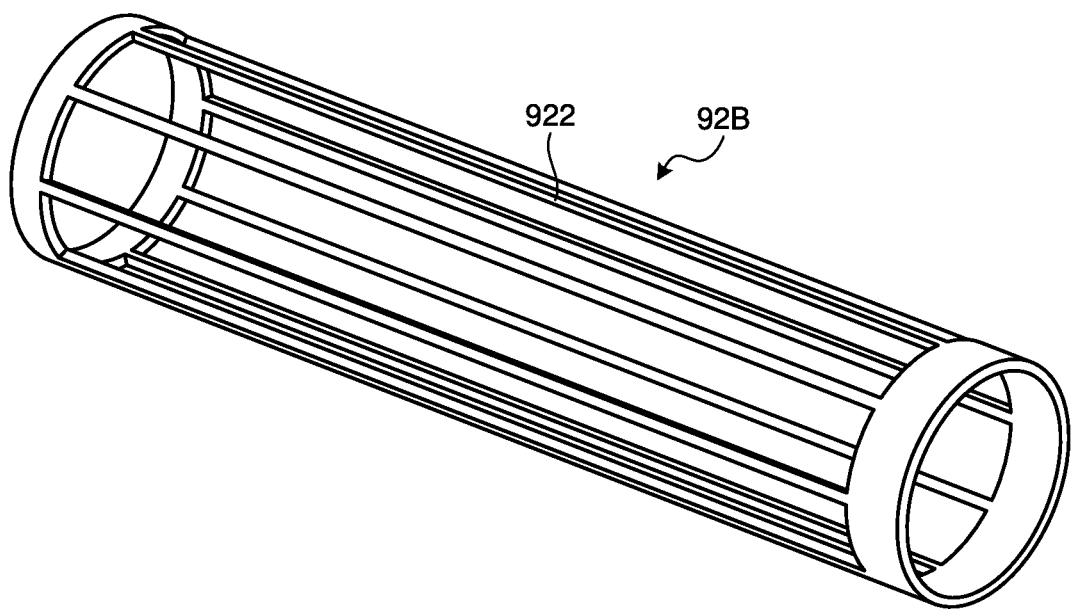
FIG. 16 is a partial sectional view illustrating a structure of a relevant portion of a probe unit according to a third modification of the third embodiment of the present invention, illustrating a structure of a conductive pipe.

FIG. 16 is a partial sectional view illustrating a structure of a relevant portion of a probe unit according to a third modification of the third embodiment of the present invention, illustrating a structure of a conductive pipe. In this third modification, a conductive pipe 92B illustrated in FIG. 16 is provided, instead of the conductive pipe 92, in the connection pipes 9, 9A according to the third embodiment and the first modification described above. The third modification has the same structure as that according to the third embodiment (or the first modification), except that the conductive pipe is replaced. Next, the conductive pipe 92B that is different from the structure described above will be explained.

The conductive pipe 92B is made of a conductive material such as copper, silver, and alloy or plating containing copper or silver as a main component. The conductive pipe 92B covers the outer circumferential surface of the insulating pipe 91 (or the insulating pipe 91A). The conductive pipe 92B is brought into contact with the connecting members 7, and is electrically connected to the first grounding probe 5 via the connecting members 7. The conductive pipe 92B may be composed of a plurality of (e.g., two) members.

The conductive pipe 92B is provided with a plurality of through holes 922 passing through in radial directions that perpendicularly intersect with the longitudinal axis of the conductive pipe 92B. The through holes 922 are holes extending along the longitudinal axial direction of the conductive pipe 92B. These through holes 922 are arranged along the circumferential direction.

In the second and the third modifications of the third embodiment described above, even when the through holes 921, 922 are provided to the conductive pipes, little energy flows out of the conductive pipes 92A, 92B to the external. Therefore, the impact of an energy loss resulting from the presence of the through holes 921, 922 is small.

In the structure in which the conductive pipe is provided with the through holes 921, 922, as in the second and the third modifications of the third embodiment described above, it is possible to change the impedance by changing the shapes, the size, and the arrangement of the through holes. Therefore, the impedance can be adjusted without changing the signal probe 2 or the insulating pipe, so that the freedom in the impedance adjustment can be improved.

For example, if the pitch between the signal probes 2 is reduced, because the diameter of the signal probe 2 can only be reduced to a limited degree, the impedance becomes reduced, the signals are reflected more, and the electric characteristic deteriorates. However, by providing through holes 921, 922 such as those according to the second and the third modifications described above, it is possible to increase the impedance by weakening the ground coupling. In this manner, when the pitch between the signal probes 2 is reduced, a deterioration of the electric characteristic can be suppressed.

The structures of the contact probes explained herein are merely some examples, and various types of probes having been conventionally known may also be used. For example, without limitation to the structures including plungers and a coil spring, such as those described above, the probe may be a probe provided with a pipe member, a pogo pin, a solid conductive member, a conductive pipe, or a wire probe obtaining a load with wires warped in a bow-like shape, or a connector terminal (connector) that connects electrical contacts, or these probes may be combined as appropriate.

Furthermore, explained in the first to the third embodiments is an example in which the connecting member is provided to the probe holder on each of the side facing the semiconductor integrated circuit 100 and the side facing the circuit board 200, but the connecting member may be provided only to one of these sides of the probe holder.

INDUSTRIAL APPLICABILITY

As described above, the probe unit according to the present invention is suitable for improving the freedom in the impedance adjustment.

REFERENCE SIGNS LIST 1 probe unit
2 contact probe (signal probe)
3, 3A probe holder
4 holder member
5 first contact probe (first grounding probe)
6 second contact probe (second grounding probe)
7, 7A, 7B, 7C, 8, 8A connecting member
9 connection pipe
21 first plunger
22 second plunger
23 spring member
23*a* tightly wound portion
23*b* sparsely wound portion
100 semiconductor integrated circuit
101, 102, 201, 202 electrode
200 circuit board

The invention claimed is:
1. A probe unit comprising:
 a plurality of contact probes each of which has one end that is brought into contact with a contacting electrode, the one end being an end in a longitudinal direction;
 a first ground member connected to an external ground;
 a second ground member provided around each of the contact probes;
 a first connecting member electrically connected to the first ground member, and electrically connected to one end of the second ground member;
 a second connecting member electrically connected to the first ground member, and electrically connected to another end of the second ground member; and
 a probe holder configured to hold the contact probes, the first ground member, the second ground member and the first and the second connecting members;
 wherein each second ground member is a conductive member provided around the contact probe, electrically connected to the first and the second connecting members, and configured to extend and contract in a long-axial direction.

2. The probe unit according to claim 1, wherein each of the first and the second connecting members is a plate-like conductive member.

3. The probe unit according to claim 2, wherein each of the first and the second connecting members has an insertion hole through which the first ground member is passed, and a part of which is brought into contact with the first ground member.

4. The probe unit according to claim 1, wherein each of the first and the second connecting members includes:
 a base portion made of an insulating material; and
 conductive members provided on outer surfaces of the base portion, the outer surfaces being surfaces on a sides where the respective first and the second connecting members are connected to the second ground member, the conductive member being electrically connected to the first ground member.

5. The probe unit according to claim 4, wherein
 the base portion has an insertion hole allowing the first ground member to be passed therethrough, and
 the conductive members are configured to extend across the surfaces on the sides where the respective first and the second connecting members are connected to the second ground member, to an inner wall of the insertion hole.

6. The probe unit according to claim 4, wherein the conductive member is a film made of a conductive material film.

7. The probe unit according to claim 4, wherein the conductive member is a plate-like member made of a conductive material.

8. The probe unit according to claim 1, wherein the second ground member includes:
 an insulating pipe member provided around the contact probe; and
 a conductive member provided to an outer circumference of the pipe member, and electrically connected to the first and the second connecting members.

9. The probe unit according to claim 8, wherein the conductive member has a plurality of through holes passing through in radial directions that perpendicularly intersect with a longitudinal axis of the conductive member.

10. The probe unit according to claim 1, wherein
 the first connecting member contacts one end of the first ground member, and
 the second connecting member contacts another end of the first ground member.

* * * * *